United States Patent
Gratz et al.

(10) Patent No.: US 7,368,341 B2
(45) Date of Patent: May 6, 2008

(54) SEMICONDUCTOR CIRCUIT ARRANGEMENT WITH TRENCH ISOLATION AND FABRICATION METHOD

(75) Inventors: Achim Gratz, Dresden (DE); Klaus Knobloch, Weixdorf (DE); Franz Schuler, Dresden (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/445,405

(22) Filed: Jun. 1, 2006

(65) Prior Publication Data

US 2007/0037339 A1 Feb. 15, 2007

Related U.S. Application Data

(62) Division of application No. 10/778,014, filed on Feb. 12, 2004, now Pat. No. 7,129,540.

(30) Foreign Application Priority Data

Feb. 14, 2003 (DE) ................................ 103 06 318

(51) Int. Cl.
*H01L 21/8238* (2006.01)
(52) U.S. Cl. ..................... 438/201; 438/243; 438/734; 257/E21.209; 257/E21.682; 257/E21.703; 257/E27.103; 257/E27.112; 257/E29.302
(58) Field of Classification Search ................ 438/201, 438/243, 246, 263, 734

See application file for complete search history.

(56) References Cited

U.S. PATENT DOCUMENTS

| | | | |
|---|---|---|---|
| 5,319,329 A | 6/1994 | Shiau et al. | 333/204 |
| 5,545,583 A | 8/1996 | Lam et al. | 437/52 |
| 5,618,751 A * | 4/1997 | Golden et al. | 438/392 |
| 5,834,806 A | 11/1998 | Lin et al. | 257/306 |
| 6,025,626 A | 2/2000 | Tempel | 257/315 |
| 6,495,853 B1 | 12/2002 | Holbrook et al. | 257/30 |
| 6,699,794 B1 * | 3/2004 | Flietner et al. | 438/700 |
| 6,720,611 B2 | 4/2004 | Jang | 257/315 |
| 6,878,600 B2 * | 4/2005 | Birner et al. | 438/386 |
| 2002/0024081 A1 | 2/2002 | Gratz | 257/315 |
| 2002/0096703 A1 | 7/2002 | Vora | 257/315 |
| 2002/0113263 A1 | 8/2002 | Fujishima et al. | 257/330 |
| 2002/0182819 A1 * | 12/2002 | Schrems et al. | 438/386 |
| 2003/0075773 A1 | 4/2003 | Deml et al. | 257/510 |
| 2004/0232450 A1 | 11/2004 | Yilmaz | 257/213 |
| 2006/0220093 A1 * | 10/2006 | Van Schaijk et al. | 257/315 |

FOREIGN PATENT DOCUMENTS

| | | | |
|---|---|---|---|
| DE | 10229066 | | 1/2004 |
| KR | 2003002709 | | 1/2003 |
| WO | WO 02/39501 | * | 5/2002 |

* cited by examiner

*Primary Examiner*—A. Sefer
(74) *Attorney, Agent, or Firm*—Brinks Hofer Gilson & Lione

(57) ABSTRACT

An explanation is given of, inter alia, a circuit arrangement containing a trench which penetrates through a charge-storing layer (18) and a doped semiconductor layer (14). The trench simultaneously fulfils a multiplicity of functions, namely an insulating function between adjacent components, the patterning of the charge-storing layer and also the subdivision of doping layers of the semiconductor layer (14).

19 Claims, 3 Drawing Sheets

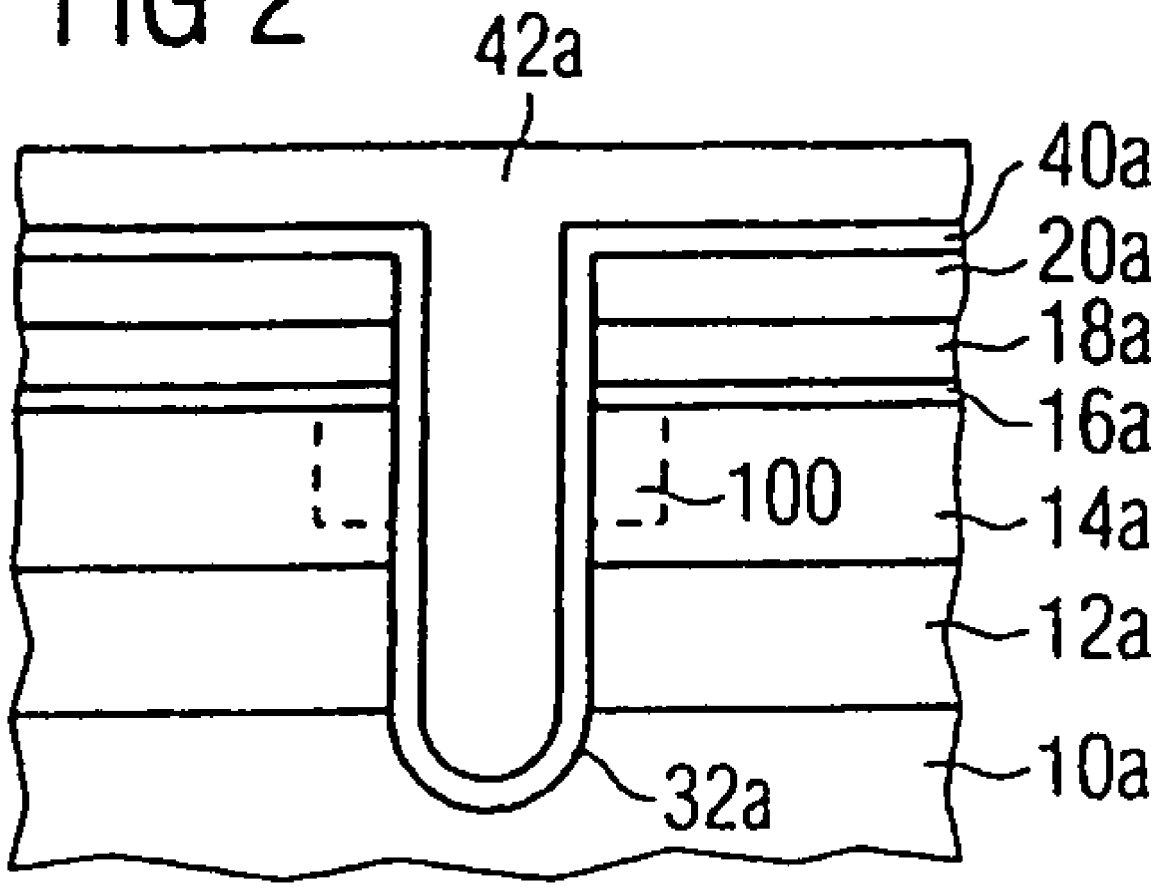

SEMICONDUCTOR CIRCUIT ARRANGEMENT WITH TRENCH ISOLATION AND FABRICATION METHOD

CROSS REFERENCE TO RELATED APPLICATIONS

This is a divisional of U.S. application Ser. No. 10/778,014, filed Feb. 12, 2004, now U.S. Pat. No. 7,129,540, which is incorporated herein by reference. Further, this application claims the priority of German Patent Application 103 06 318.8 filed in the German Patent Office on Feb. 14, 2003, which is incorporated herein by reference.

BACKGROUND OF THE INVENTION

The invention relates to a semiconductor circuit arrangement having a substrate, which carries in the order specified:

a doped semiconductor layer of a first conductivity type or conduction type, an electrically insulating layer, and an electrically conductive or an electrically insulating charge-storing layer, which is suitable for the storage of charges.

Moreover, the semiconductor circuit arrangement contains at least one trench which penetrates through the charge-storing layer and also extends into the doped semiconductor layer.

The substrate is for example a wafer made of a semiconductor material, e.g. made of silicon. The layer suitable for the storage of charges is also referred to as floating gate particularly in the case of circuit arrangements having memory cells.

BRIEF SUMMARY OF THE INVENTION

It is an object of the invention to specify an integrated circuit arrangement which is simple to fabricate and simple to drive and, in particular, has very good electrical properties. In particular, the intention is to specify a circuit arrangement having a multiplicity of memory cells. Moreover, the invention relates to a method which can be used, in particular, to fabricate the semiconductor circuit arrangement.

The invention is based on the consideration that there are in principle two possibilities for fabricating the trench. Thus, it is possible to fabricate the trench, apart from auxiliary layers which are completely removed again after the formation of the trench, before the application of layers which remain in the circuit arrangement, so that the trench does not penetrate through these layers. On the other hand, it is possible to introduce the trench only after layers which remain in the circuit arrangement have been applied to the substrate, so that the trench penetrates through these layers.

The invention is furthermore based on the consideration that the production of the trench after the application of layers which remain in the circuit arrangement simultaneously permits the patterning of these layers and the orientation of the trench with respect to the patterned regions, i.e. a so-called self-alignment. However, it is possible for the trench to be assigned further functions in the integrated circuit arrangement. In the circuit arrangement according to the invention, the trench also serves, moreover, for subdividing the doped semiconductor layer. This requires the trench to be deeper than the thickness of the doped semiconductor layer. Thus, in the circuit arrangement according to the invention, the trench also has, besides the insulating function for insulating adjacent components, two further functions, namely:

the patterning of the charge-storing layer, and the patterning and insulation of the doped semiconductor layer.

In one refinement, the circuit arrangement contains a plurality of trenches arranged next to one another, for example trenches lying parallel to one another.

Arranged between the trenches are in each case a multiplicity of memory cells, in particular EEPROM memory cells or flash EEPROM memory cells (Electrically Erasable Programmable Read Only Memory). In a next refinement, the charge-storing layer is subdivided into charge-storing regions transversely with respect to the direction in which the trenches lie.

In one development of the circuit arrangement, a doped semiconductor layer having a conductivity type opposite to the first conductivity type is arranged between the doped semiconductor layer and the substrate. The trench also penetrates through the semiconductor layer of opposite conduction type and extends into the substrate. The subdivision of a doped semiconductor layer by means of two trenches, e.g. in the so-called bit line direction, already leads to a multiplicity of advantages with regard to the operation of the memory cells. By way of example, memory cells can be selectively erased. The demarcation of a further lower semiconductor layer lying below the upper semiconductor layer with the aid of the trenches leads to a further improvement of the electrical properties. By way of example, there is a reduction in the junction capacitance between the two semiconductor layers for each individual bit line. Furthermore, additional options are afforded for the electrical driving of the components.

In an alternative development with two additional semiconductor layers, the trench ends, by contrast, in the semiconductor layer of opposite conduction type, so that only the semiconductor layer of the first conduction type is separated by the trenches. This measure is sufficient for many applications and simpler to carry out than severing both or more than two semiconductor layers with the aid of the trenches.

In one refinement, the substrate is a semiconductor substrate which preferably contains silicon or comprises silicon. The silicon is weakly pre-doped, for example. In another refinement, the doped semiconductor layer forms the channel region of a transistor or the channel regions of a multiplicity of transistors. In a next refinement, the first conductivity type is the p conductivity type, i.e. electrical conduction through defect electrons or so-called holes. In an alternative refinement, the first conductivity type is the n conductivity type, i.e. electrical conduction through conduction electrons.

In a next refinement, the electrically insulating layer contains an oxide or comprises an oxide, in particular a silicon dioxide which is preferably thermally produced or deposited. During the programming and erasure of the memory cells, charge carriers tunnel through or surmount the electrically insulating layer adjoining the substrate. During programming, e.g. electrons or electron holes are stored in the charge-storing layer. Charge carriers, which are also referred to as hot carriers in this context, are accelerated during programming and/or erasure on account of an electric field in such a way that they can surmount an energy barrier between the charge-storing layer and the substrate. As an alternative, by the application of a suitable potential gradient, the energy barrier may be reduced in such a way that charge carriers can tunnel through it.

In a next refinement, the charge-storing layer contains polycrystalline silicon or comprises polycrystalline silicon, preferably doped polycrystalline silicon. In an alternative refinement, the charge-storing layer contains a nonmetal nitride or comprises a nonmetal nitride, in particular silicon nitride. In another alternative refinement, the charge-storing layer contains another material which is able to bind charge carriers for example in material defects such as, for example, aluminum oxide or hafnium oxide.

In one development of the circuit arrangement according to the invention, an electrically conductive layer is provided, which is patterned as word lines. A further electrically insulating layer is arranged between the electrically conductive layer and the charge-storing layer. In one refinement, the trench or the trenches which extend into the semiconductor layer do not penetrate through said electrically conductive layer and said electrically insulating layer.

In one refinement, the electrically conductive layer contains a polycrystalline material or a metal. By way of example, the electrically conductive layer comprises polycrystalline silicon, in particular doped polycrystalline silicon. In a next refinement, the electrically conductive layer is subdivided into strips lying transversely or at an angle of 90 degrees with respect to the trenches. In another refinement, the electrically conductive layer has subdivisions at locations at which the charge-storing layer is also subdivided, that is to say that the two layers have been patterned using the same mask.

In one development of the circuit arrangement, there is at least one trench, which is shallower and wider in comparison with the trench penetrating through the electrically insulating layer and which is arranged in the semiconductor layer of the first conductivity type and through which penetrates the deep trench penetrating through the electrically insulating layer. This measure, without relatively high process-technological outlay, results in degrees of freedom for the method implementation, because the shallow trench can be used as additional insulation. The process-technological additional outlay is low because shallow trenches have to be produced anyway in many circuit arrangements. In particular, shallow trenches are used in logic circuits. Shallow trenches typically have a depth of less than 500 nm (nanometers). By contrast, the deep trench has a depth of greater than 700 nm, greater than 1 µm (micrometer) or even greater than 1.5 µm. The depth of the deep trench depends, in particular, on the voltage conditions, because the latter in turn determine the thickness of the doped semiconductor layers which are intended to be subdivided by the deep trenches parallel to the bit lines.

In a next development of the circuit arrangement, the shallow trench does not penetrate through the charge-storing layer and/or the electrically insulating layer. Thus, the shallow trench must have been fabricated, and in particular also filled, before the application of these two layers. This means that shallow trench and deep trench are processed independently of one another. In particular, the depths of the different types of trench can be defined and optimized independently of one another. Furthermore, this method procedure avoids problems which arise on account of the major height differences in the case of the simultaneous filling of shallow trenches and deep trenches in the case of the subsequent leveling of the surface.

In one development, the shallow trench is completely filled with an electrically insulating material or the shallow trench contains an electrically insulating material, for example silicon dioxide. In a next development, the shallow trench projects symmetrically beyond the deep trench, so that the insulation properties are equally good in a plurality of directions.

In a next development, there is at least one further shallow trench through which no trench, in particular no deep trench, penetrates. In a next development, the shallow trench through which the deep trench penetrates lies in a memory cell array and the shallow trench through which a trench does not penetrate lies in a logic circuit arrangement in which, by way of example, basic logic functions are produced, e.g. NAND switching functions. The logic circuit is e.g. part of a monolithic circuit which also contains a memory cell array having deep trenches.

In a next development, the electrically conductive layer through which the deep trench does not penetrate and/or the electrically insulating layer through which the deep trench does not penetrate are at least partly arranged in the shallow trench. This measure makes it possible to introduce a cutout into the electrically conductive layer through which the deep trench does not penetrate, without stringent requirements being made of its depth. All that is important is that the electrically conductive layer is completely interrupted. There is a relatively large leeway, for example of more than 10 nm or more than 20 nm, for the projection of the cutout into the shallow trench. Despite different depths, it is ensured that the coupling factor between the capacitance of the charge-storing layer and the electrically conductive layer is relatively independent of the depth if the cutout lies within the trench edges of the shallow trench.

In a next development of the circuit arrangement, the circuit arrangement contains a further charge-storing layer, which adjoins the charge-storing layer and, in one refinement, comprises the same material. At least one cutout is arranged in the further charge-storing layer, the bottom of said cutout preferably lying completely within the edge of the deep trench or of the shallow trench. The depth of said cutout is also non-critical provided that the further charge-storing layer is completely patterned. The same relationships as explained in the previous paragraph hold true with regard to the coupling factor of the capacitances.

In another development, the trench is filled with an electrically insulating material or the trench contains an electrically insulating material. In particular, oxides such as silicon dioxide, for example, are suitable for filling the trench. In a next development, the trench contains an electrically conductive or electrically semiconducting material insulated from the trench wall, for example a polycrystalline material, in particular polycrystalline silicon, which is doped or undoped.

The invention relates, moreover, to a method for fabricating a semiconductor circuit arrangement, in particular for fabricating the circuit arrangement according to the invention or one of its developments. Thus, the technical effects mentioned above also hold true for the method.

In one development of the method according to the invention, a hard mask layer is used for introducing the deep trench. The hard mask layer can be removed before the trench is filled. However, the hard mask layer can also be removed only after the trench has been filled with a filling material and the filling material has subsequently been etched back. What is achieved by this measure is that, during the etching-back, layers lying below the hard mask are protected by the hard mask.

BRIEF DESCRIPTION OF THE SEVERAL VIEWS OF THE DRAWINGS

Exemplary embodiments of the invention are explained below with reference to the accompanying drawings, in which:

FIG. 2 shows a fabrication stage in accordance with a second method variant with a hard mask layer which is utilized over a plurality of method steps.

DETAILED DESCRIPTION OF THE INVENTION

Figure 1A:
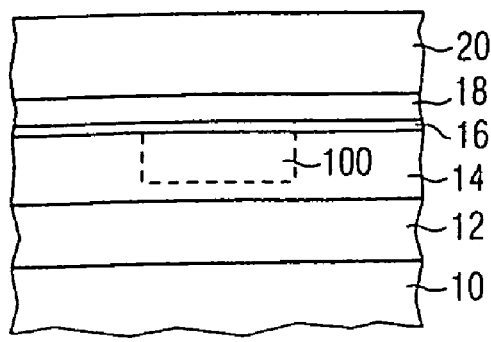
FIGS. 1A to 1F show fabrication stages in accordance with a first method variant with a hard mask layer which is removed directly after the fabrication of deep trenches.

FIG. 1A shows a weakly p-doped semiconductor substrate 10 made of silicon. An n-doped semiconductor layer has been introduced into the semiconductor substrate 10 by doping, said layer lying for example at a depth of 800 nm to 1.6 μm (micrometers). Moreover, a p-doped semiconductor layer 14 has been produced in the semiconductor substrate 10, said layer extending from the surface of the semiconductor substrate down to a depth of about 800 nm. At the edges of a cell array, the semiconductor layers 12 and 14 may be formed as a well, that is to say that they are taken as far as the surface of the semiconductor substrate 10. However, other contact-making possibilities, too, are utilized in another exemplary embodiment.

By way of example, the dopings of the semiconductor layers 12 and 14 are fabricated by implantation. Semiconductor layers 12 and 14 formed in well-type fashion are also referred to as n-well or as p-well.

An oxide layer 16 is subsequently applied, for example thermally, said layer having a thickness of 6 to 15 nm, for example. A floating gate layer 18 is then deposited on the oxide layer 16, said floating gate layer comprising in-situ-doped polycrystalline silicon, and having a thickness of 50 to 150 nm, for example.

In a subsequent method step, a hard mask layer 20, for example a TEOS layer (Tetra Ethyl Ortho Silicate) having a thickness of hundreds of nm, is applied on the floating gate layer 18. The thickness depends on the selectivity of the trench etching. In other words, given a highly selective etching or another hard mask material, the thickness may also be thinner, under certain circumstances.

Figure 1B:
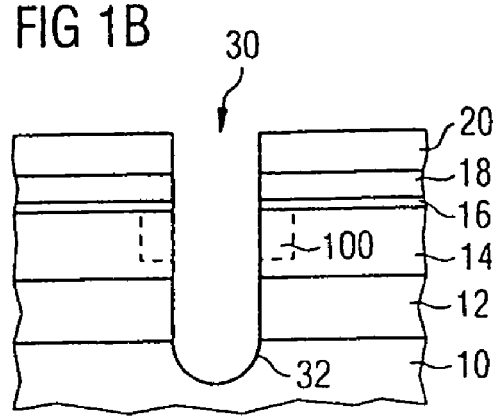

As illustrated in FIG. 1B, firstly the hard mask layer 20 is patterned with the aid of a lithography method and a photomask (not illustrated), a cutout 30 arising firstly only in the hard mask layer 20. During the fabrication of the cutout 30, etching is effected for example in a time-controlled manner. The photoresist is removed after the patterning of the hard mask layer 20. Afterward, with the aid of the patterned hard mask layer 20, the cutout 30 is extended to form a trench 32 having a depth of about 1.8 μm, for example, measured from the boundary between hard mask layer 20 and floating gate layer 18. By way of example, a reactive ion etching RIE is carried out for the etching of the trench 32. The trench 32 has a width of 200 nm, for example. The hard mask layer 20 is already thinned to a great extent during the etching of the trench 32, so that only an etching reserve of 100 nm, for example, remains.

Figure 1C:
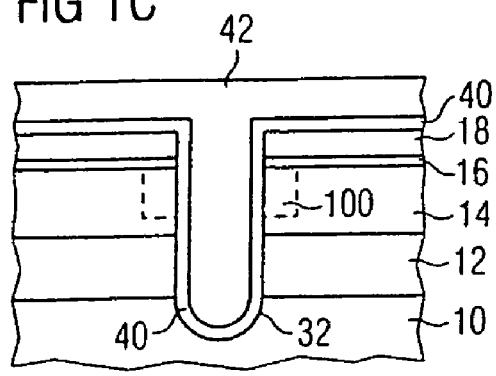

As illustrated in FIG. 1C, the hard mask layer 20 is subsequently removed or etched away. Afterward, a so-called liner oxidation is carried out, during which an oxide layer 40 having a thickness of 40 nm, for example, is produced at the wall of the trench 32 and on the floating gate layer 18. After the production of the liner oxide layer 40, a polycrystalline silicon layer 42 is deposited, which completely fills the trench 32. By way of example, a low-pressure CVD method (Chemical Vapor Deposition) is utilized for the deposition of the silicon layer 42. In the exemplary embodiment, the polycrystalline silicon layer 42 is undoped. In another exemplary embodiment, however, a doped polycrystalline silicon layer 42 is fabricated.

Figure 1D:
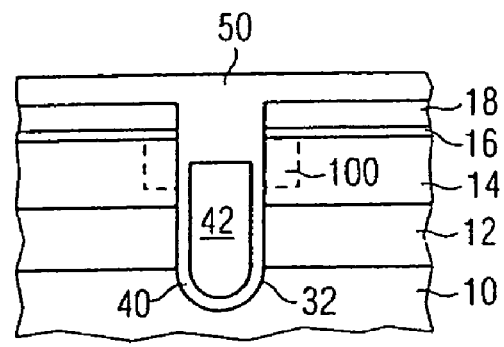

As illustrated in FIG. 1D, regions of the silicon layer 42 which lie outside the trench 32 are subsequently removed, for example with the aid of a reactive ion etching method. Moreover, in the upper region of the trench 32, the silicon layer 42 is removed selectively with regard to the oxide layer 40, for example down to a depth of 300 nm below the boundary between oxide layer 16 and p-doped semiconductor layer 14. After the etching of the silicon layer 42, an insulating filling material 50 is introduced into the upper part of the trench 32, for example silicon dioxide with the aid of an HDP method (High Density Plasma). An oxide layer 50 is produced in the upper region of the trench 32 and on the floating gate layer 18.

Figure 1E:
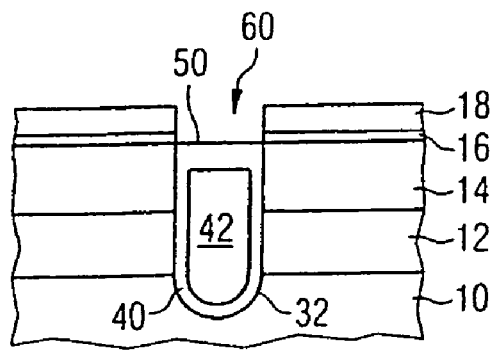

As illustrated in FIG. 1E, the oxide layer 50 is subsequently etched back over the whole area, a cutout 60 arising in the upper region of the trench 32. The etching-back of the oxide layer 50 is carried out for example with the aid of an RIE method (reactive ion etching) or with the aid of a wet etching. The bottom of the cutout 60 should not lie below the boundary between oxide layer 16 and p-doped semiconductor layer 14.

Figure 1F:
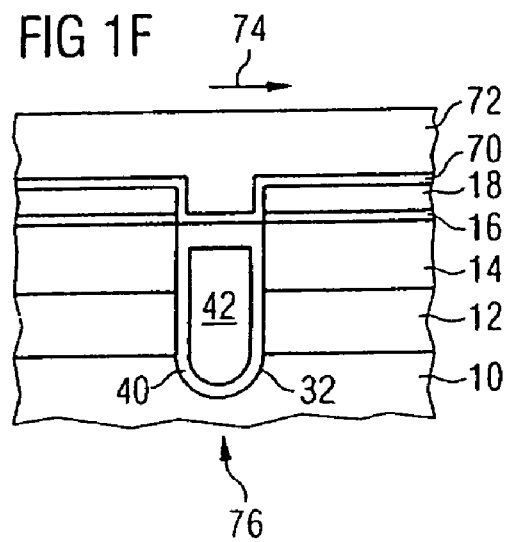

As shown in FIG. 1F, a dielectric layer 70 is subsequently deposited, for example an ONO layer (Oxide-Nitride-Oxide). The dielectric layer 70 has a thickness of less than 20 nm, for example. After the application of the dielectric layer 70, a control gate layer 72 is applied, for example made of in-situ-doped polycrystalline silicon and having a thickness of e.g. greater than 100 nm.

In subsequent method steps (not illustrated), the control gate layer 72, the dielectric layer 70 and the floating gate layer 18 are patterned simultaneously in a word line direction, which lies parallel to the sheet plane, see arrow 74. A bit line direction lies perpendicular to the sheet plane and corresponds to the direction of the trench 32. After the patterning of the control gate layer 72, channel and source regions are introduced into the p-doped semiconductor layer 14 by doping, said regions lying in front of and behind the sheet plane, respectively, with reference to FIG. 1F. One or a plurality of metallization layers for making contact with the memory cells are applied in further method steps. Finally, a memory circuit 76 is completed, containing the arrangement illustrated in FIG. 1F.

FIG. 2 shows a fabrication stage in accordance with a second method, in which a hard mask layer 20a is used over a plurality of method steps. Proceeding from a semiconductor substrate 10a, the method steps presented above with reference to FIGS. 1A and 1B are performed for producing an n-doped semiconductor layer 12a, a p-doped semiconductor layer 14a, an oxide layer 16a and a floating gate layer 18a. Reference is made to FIGS. 1A to 1B with regard to the details. Afterward, the hard mask layer 20a is applied and patterned with the aid of a photolithographic method, the floating gate layer 18a initially remaining unpatterned. After the removal of the photoresist, the patterned hard mask layer 20a is used for producing a trench 32a having the same properties as the trench 32.

With the hard mask layer 20a still present on the oxide layer 18a, a for example thermal liner oxidation is subsequently carried out for producing an oxide layer 40a situated at the walls of the trench 32a and on the hard mask layer 20a.

In a next method step, a doped or undoped polycrystalline silicon layer 42a is deposited, which completely fills the trench 32a. Afterward, the polycrystalline silicon layer 42a is etched back for example with the aid of a reactive ion etching method, the silicon layer 42a being removed outside the trench 32a and in the upper region thereof. Those regions of the oxide layer 40a which lie on the hard mask layer 20a are also removed in this case. The hard mask layer 20a protects the floating gate layer 18a during the etching-back.

The hard mask layer 20a is removed after the etching-back. Afterward, further processing is effected in the manner explained above with reference to FIGS. 1D to 1F, i.e. application of an oxide layer corresponding to the oxide layer 50, etc.

Figure 3A:
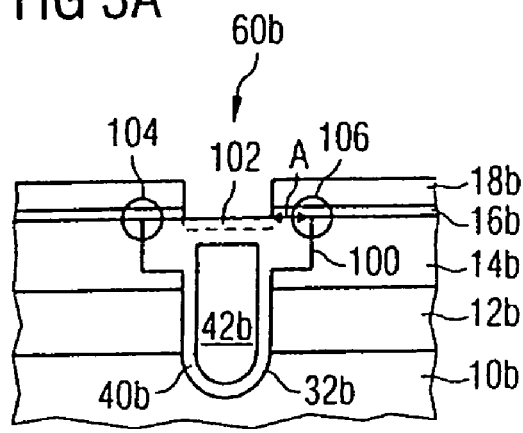
FIGS. 3A and 3B show fabrication stages in accordance with a third method variant with shallow trenches through which deep trenches penetrate.
Figure 3B:
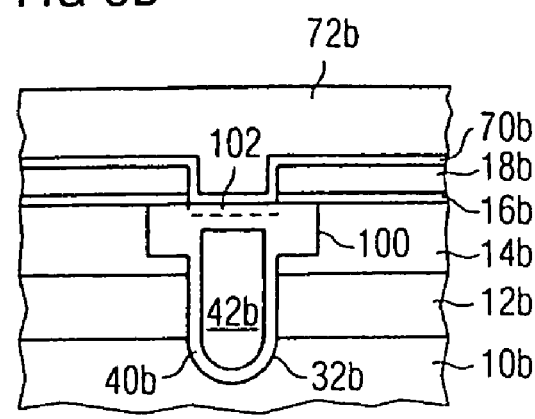

FIGS. 3A and 3B show fabrication stages in accordance with a third method variant, in which a deep trench 32b penetrates through a shallow trench 100. The shallow trench 100 is produced in a semiconductor substrate 10b, corresponding to the semiconductor substrate 10, before or after the application of an oxide layer 16b, corresponding to the oxide layer 16, and a floating gate layer 18b, corresponding to the floating gate layer 18, for example before the implantation for producing an n-doped semiconductor layer 12b or a p-doped semiconductor layer 14b. Except for the introduction of the trench 100, the method steps explained with reference to FIGS. 1A to 1D are performed unchanged, see broken line 100 in said figures. When the state illustrated in FIG. 1D is reached, an oxide layer corresponding to the oxide layer 50 is etched back, a cutout 60b arising in the upper region of the trench 32b. During the etching-back, it is not critical if the bottom of the cutout 60b lies below the boundary between the oxide layer 16b and the semiconductor layer 14b. By way of example, it is possible to etch into the shallow trench 100 to an extent of tens of nm, see broken line 102. The trench 100 is filled with an insulating material, for example with silicon dioxide. This insulating material, even with the bottom of the cutout 60b lying at a deeper level, affords a sufficient insulation between the subsequently applied control gate and the semiconductor layer 14b.

This is because the trench 100 has a larger width than the trench 32b. In the exemplary embodiment, the shallow trench 100 has a width of 300 nm and a depth of 400 nm. Given a symmetrical arrangement of the deep trench 32b with respect to the shallow trench 100, the shallow trench 100 projects beyond the deep trench 32b by a distance A of 50 nm on each side. The larger width of the trench 100 also prevents instances of incipient etching of the tunnel oxide 16b in edge regions of the trench 100 during the etching of the cutout 60b, see regions 104 and 106, which leads to a higher reliability.

As illustrated in FIG. 3B, a dielectric layer 70b, corresponding to the dielectric layer 70, is subsequently applied. A control gate layer 72b, corresponding to the control gate layer 72, is then applied. The other method steps explained with reference to FIG. 1F are subsequently performed.

The method with a shallow trench through which a deep trench penetrates is carried out, in accordance with a fourth method variant, also in the case of the method variant explained with reference to FIG. 2, see broken line 100 in FIG. 2. That is to say that a hard mask layer corresponding to the hard mask layer 20a can be utilized for a plurality of method steps even when a deep trench corresponding to the deep trench 32a penetrates through the shallow trench 100.

Figure 4A:
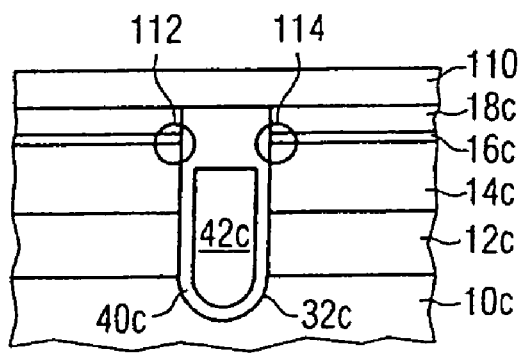
FIGS. 4A and 4B show fabrication stages in accordance with a further method variant with a floating gate double layer.
Figure 4B:
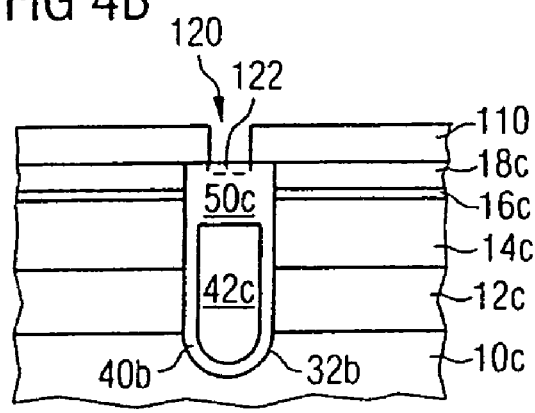

FIGS. 4A to 4B show a fifth method variant, in which a floating gate double layer comprising a floating gate layer 18c, corresponding to the floating gate layer 18, and a floating gate layer 110 is fabricated. The method steps up to the etching-back of an oxide layer 50c corresponding to the oxide layer 50 are the same as explained above with reference to FIGS. 1A to 1D. For a semiconductor substrate 10c, an n-doped semiconductor layer 12c, a p-doped semiconductor layer 14c, an oxide layer 16c, a trench 32c, an oxide layer 40c and a polycrystalline silicon trench filling 42c, reference is made to the explanations with respect to FIGS. 1A to 1D.

In a departure from the method explained with reference to FIG. 1D, the oxide layer 50c is etched back only as far as the floating gate layer 18c, the floating gate layer 18c serving as an etching stop layer. The trench 32c thus remains filled with the oxide layer 50c in its upper region as well.

This procedure, as also explained with reference to FIG. 3A, prevents damage to the thin oxide of the oxide layer 16c at the edges 112 and 114 of the trench 32c during the etching-back of the oxide layer.

The floating gate layer 110 is then deposited, for example polycrystalline silicon, which is doped in situ.

As illustrated in FIG. 4B, the floating gate layer 110 is then patterned with the aid of a photolithographic method. In this case, a cutout 120 is produced above the trench 32c, the width of said cutout being less than the width of the trench 32c. The cutout 120 is oriented symmetrically with respect to the trench center of the trench 32c. During the etching of the cutout 120, care has to be taken only to ensure that the floating gate layer 110 is completely severed. An overetching is not critical, because the bottom of the cutout 120 is surrounded on all sides by that part of the oxide layer 50c which remains in the trench 32c, see broken line 122. Even when the bottom of the cutout 120 is in a different position, there is only an insignificant change in a coupling factor of the capacitances between the floating gate and the control gate of the memory cells to be fabricated on account of the projection of the floating gate layer 110 over the floating gate layer 18c.

Afterward, the method steps explained above with reference to FIG. 1F are carried out. Instead of a three-layer ONO layer, it is also possible to use a single-layer dielectric layer.

In accordance with a sixth method variant, the methods in accordance with FIG. 2 and in accordance with FIGS. 4A and 4B are combined, so that the hard mask is utilized for a plurality of method steps even in a method in which a floating gate double layer is produced. The etching-back of the oxide layer is then carried out e.g. in a time-controlled manner. The hard mask is then removed.

The cutout 120 can also be made wider than the trench 32c. On the basis of the two lithography methods for the two floating gate layers 18c and 110, the width of the trench 32c and the width of the cutout 120 can be chosen independently of one another.

In other exemplary embodiments, a CMP method (Chemical Mechanical Polishing) is also used instead of etching-back. Instead of a hard mask layer made of TEOS, it is also possible to use a hard mask layer made of another material, for example made of a nitride such as silicon nitride. If the deep trench has a smaller depth than in the exemplary embodiments, a photoresist layer may also be used instead of the hard mask.

Consequently, a plurality of variants for fabricating nonvolatile memory cells has been explained, in which:

deep isolation trenches are used for flash EEPROM memory cells or for simple EEPROM memory cells, method sections, i.e. so-called modules, for fabricating shallow isolation trenches (STI—Shallow Trench Isolation) and modules for fabricating and filling deep trenches (DTI—Deep Trench Isolation) can be carried out in a simple manner, in particular successively, in a fabrication process, and the problems of "classic" integration, in which deep trenches and shallow trenches are fabricated at the start of the method, are avoided. In particular, no problems arise during the planarization of HDP oxide fillings (High Density Plasma) which have a different height above the shallow trenches and the deep trenches.

In the exemplary embodiments explained, deep trench isolations lead to insulated well strips. The trenches in the memory cell array have a larger depth than trenches in the drive circuit of the memory array or in a logic circuit applied on the same chip. On account of the filling with polycrystalline silicon, it is possible to fabricate deep trenches having a small ratio of width to depth, e.g. with ratios smaller than ¼ or ¹⁄₁₀.

The methods explained are suitable in particular for memory cells based on a cell concept in which the charges are applied to the floating gate or are removed from the floating gate on the basis of the Fowler-Nordheim tunnel effect.

The variant with a deep trench through which no shallow trench penetrates makes it possible:

to manage with a small chip area for the insulation, to avoid problems of alignment between shallow trenches and deep trenches, so that no additional tolerances have to be provided, and to planarize shallow trenches lying outside the cell array without any problems.

The variant with a deep trench through which a shallow trench penetrates makes it possible:

to improve the insulation between control gate and substrate or p-doped region, to achieve larger coupling factors on account of the reduced coupling of floating gate and substrate, to be able to set the coupling factor better, and to be able to etch back the filling oxide of the trench more easily.

Both variants make it possible:

to avoid additional CMP steps (Chemical Mechanical Polishing), to avoid a CMP method with major height differences, and to carry out and to optimize processes for fabricating the shallow trenches independently of processes for fabricating the deep trenches.

The methods explained make it possible, in particular, to avoid or reduce damage to the sensitive tunnel oxide in particular at the edges of the trenches, so that the yield and reliability increase. Moreover, it is thus possible to produce strips made from the doped wells in a simple manner, said strips running in the bit line direction.

In other exemplary embodiments, the same structures are fabricated based on other doping layer sequences, e.g. p-substrate and n-well. An alternative is to work with n-substrate and p-well. A third alternative works with n-substrate and p-well and also n-well.

The invention claimed is:

1. A method for fabricating a semiconductor circuit arrangement comprising:

forming a doped semiconductor layer of a first conductivity type;

disposing an electrically insulating layer on the doped semiconductor layer;

disposing a charge storing layer on the electrically insulating layer;

forming a deep trench that penetrates through the charge storing layer, the insulating layer and into the semiconductor layer; and forming a shallow trench which does not penetrate through the charge storing layer and the insulating layer, the shallow trench extending about laterally symmetrical in all directions beyond an edge of the deep trench.

2. The method of claim 1, further comprising disposing a mask on the charge storage layer; and forming the deep trench using the mask as a protection for the charge storage layer.

3. The method of claim 2, where the mask comprises a photoresist.

4. The method of claim 2, where the mask comprises a hard mask layer.

5. The method of claim 4, where the hard mask layer is formed from Tetra Ethyl Ortho Silicate (TEOS).

6. The method of claim 2, further comprising:

filling the deep trench with a filling material; and etching back the filling material.

7. The method of claim 6, further comprising removing the mask after forming the deep trench and before filling the deep trench with the filling material.

8. The method of claim 6, further comprising forming an oxide liner on the inner wall of the deep trench wherein the oxide liner is formed before filling the deep trench.

9. The method of claim 6, where the etching back includes a chemical mechanical polishing (CMP) process.

10. The method of claim 6, further comprising:

etching back the filling material so that a region uncovered during the etching back process extends into a region where the semiconductor layer was formed; and filling the uncovered region with a second filling material.

11. The method of claim 10, wherein the second filling material comprises an oxide.

12. The method of claim 1, further comprising:

forming a shallow trench in the doped semiconductor layer wherein the shallow trench is shallower and wider than the deep trench;

filling the shallow trench with a filling material; and planarizing the filling material in the shallow trench, wherein the forming, filling and planarizing steps are performed before disposing the charge storing layer.

13. The method claim 12, further comprising etching the filling material such that the region uncovered during the etching extends into a region where the semiconductor layer was formed.

14. The method of claim 13, further comprising further filling the uncovered region with an insulating material.

15. The method of claim 13, further comprising further filling the uncovered region with a conducting material.

16. The method of claim 12, further comprising:

disposing at least one further conducting charge-storing layer adjoining the charge storing layer; and patterning the at least one further charge storing layer, wherein the patterning of the further charge storing layer forms a cutout that extends into the deep trench.

17. The method of claim 16, where the patterning is performed before disposing further layers on the further charge storing layer.

18. The method of claim 12, further comprising:
disposing a further insulating charge storing layer adjoining the charge-storing layer; and
patterning the further charge storing layer, where the patterning of the further charge storing layer forms a cutout that extends into the deep trench.

19. The method of claim 18, where the patterning is performed before applying further layers on the further charge storing layer.

* * * * *